(12) United States Patent
Levitan et al.

(10) Patent No.: US 7,064,879 B1
(45) Date of Patent: Jun. 20, 2006

(54) MAGNETICALLY ACTUATED MICROELECTROCHEMICAL SYSTEMS ACTUATOR

(75) Inventors: Jeremy A. Levitan, Cambridge, MA (US); Michael J. Sinclair, Kirkland, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 09/544,799

(22) Filed: Apr. 7, 2000

(51) Int. Cl.
*G02B 26/08* (2006.01)

(52) U.S. Cl. ............... 359/224; 359/872; 335/149; 335/219

(58) Field of Classification Search ............... 359/223, 359/224, 855, 872, 877, 896, 290; 316/328; 335/205; 355/149, 219
See application file for complete search history.

(56) References Cited

U.S. PATENT DOCUMENTS

| | | | |
|---|---|---|---|
| 3,071,036 A | 1/1963 | McKnight et al. | |
| 4,157,861 A * | 6/1979 | Davies | |
| 4,421,381 A * | 12/1983 | Ueda et al. | |
| 5,061,914 A | 10/1991 | Busch et al. | 337/140 |
| 5,062,689 A | 11/1991 | Koehler | 359/230 |
| 5,084,044 A | 1/1992 | Quint | 606/27 |
| 5,099,352 A * | 3/1992 | Yamamoto et al. | |
| 5,276,545 A * | 1/1994 | Daun et al. | 359/223 |
| 5,392,140 A | 2/1995 | Ezra et al. | 359/41 |
| 5,455,706 A * | 10/1995 | Brotz | 359/872 |
| 5,469,291 A * | 11/1995 | Plesko | 359/224 |
| 5,481,396 A | 1/1996 | Ji et al. | 359/295 |
| 5,504,629 A | 4/1996 | Lim | 359/850 |
| 5,543,956 A * | 8/1996 | Nakagawa et al. | 359/872 |
| 5,612,736 A | 3/1997 | Vogeley et al. | 348/207.99 |
| 5,619,177 A | 4/1997 | Johnson et al. | 337/140 |
| 5,629,790 A * | 5/1997 | Neukermans et al. | 359/198 |
| 5,666,226 A | 9/1997 | Ezra et al. | 359/621 |
| 5,671,083 A | 9/1997 | Conner et al. | 359/291 |
| 5,700,897 A | 12/1997 | Klainer et al. | 528/15 |
| 5,748,172 A | 5/1998 | Song et al. | |
| 5,781,331 A | 7/1998 | Carr et al. | 359/288 |

(Continued)

FOREIGN PATENT DOCUMENTS

EP     0692729 A1     1/1996

(Continued)

OTHER PUBLICATIONS

Judy J W et al: "Magnetically Actuated Addressable Microstructures" Journal of Microelectromechanical systems, IEEE Inc. New York, US, vol. 6, No. 3, Sep. 1, 1997, pp. 249-255.

(Continued)

*Primary Examiner*—Ricky D. Shafer
(74) *Attorney, Agent, or Firm*—Woodcock Washburn LLP

(57) ABSTRACT

A microelectrical mechanical system (MEMS) actuator having electrically conductive coils that create first magnetic fields that are opposed by a second magnetic field is disclosed. The actuator includes two coils having dual, interspersed Archimedean spirals. Within an actuator, one coil is arranged with spirals that proceed clockwise, while the other coil is provided with spirals that proceed counterclockwise. An electrically conductive bridge mechanically couples the two coils of each actuator to a mirror. Opposing magnetic fields are created to provide a force that urges the coils to expand so that the outermost portions of the coil extend upward, away from the substrate, and lift the bridge and mirror. Control current may then be modulated to increase and decrease the coil's magnetic field strength thereby increasing and decreasing the coil's extension to raise and lower relative to the substrate.

6 Claims, 6 Drawing Sheets

U.S. PATENT DOCUMENTS

| | | | |
|---|---|---|---|
| 5,784,189 A | 7/1998 | Bozler et al. | 359/254 |
| 5,870,007 A | 2/1999 | Carr et al. | 333/262 |
| 5,920,417 A * | 7/1999 | Johnson | 359/223 |
| 5,969,710 A | 10/1999 | Doherty et al. | 345/148 |
| 5,994,816 A | 11/1999 | Dhuler et al. | 310/307 |
| 6,023,121 A | 2/2000 | Dhuler et al. | 310/307 |
| 6,046,840 A | 4/2000 | Huibers | 359/291 |
| 6,108,118 A | 8/2000 | Minamoto | |
| 6,122,089 A | 9/2000 | Minamoto et al. | |
| 6,130,464 A | 10/2000 | Carr | 257/417 |
| 6,137,623 A | 10/2000 | Roberson et al. | 359/291 |
| 6,188,504 B1 | 2/2001 | Murakami et al. | |
| 6,220,730 B1 | 4/2001 | Hewlett et al. | 362/297 |
| 6,229,684 B1 | 5/2001 | Cowen et al. | 361/278 |
| 6,236,491 B1 | 5/2001 | Goodwin-Johansson | 359/291 |
| 6,246,504 B1 | 6/2001 | Hagelin et al. | 359/212 |
| 6,249,370 B1 | 6/2001 | Takeuchi et al. | 359/291 |
| 6,259,548 B1 * | 7/2001 | Tsugai et al. | 359/224 |
| 6,275,325 B1 | 8/2001 | Sinclair | 359/291 |
| 6,333,583 B1 | 12/2001 | Mahadevan et al. | 310/306 |
| 6,367,251 B1 | 4/2002 | Wood | 60/528 |
| 6,388,789 B1 * | 5/2002 | Bernstein | 359/198 |
| 6,422,011 B1 | 7/2002 | Sinclair | 60/528 |
| 6,438,954 B1 | 8/2002 | Goetz et al. | 60/527 |
| 6,531,947 B1 | 3/2003 | Weaver et al. | 337/139 |
| 6,535,311 B1 | 3/2003 | Lindquist | 359/128 |
| 6,567,295 B1 | 5/2003 | Taussig et al. | 365/105 |
| 6,587,612 B1 | 7/2003 | Mitchell et al. | 385/18 |
| 6,672,724 B1 | 1/2004 | Peterson et al. | 353/81 |
| 6,708,491 B1 | 3/2004 | Weaver et al. | 428/143 |
| 6,708,492 B1 | 3/2004 | Sinclair | 60/527 |
| 6,785,039 B1 | 8/2004 | Wendland, Jr. | 359/290 |
| 6,804,959 B1 | 10/2004 | Sinclair | 60/527 |
| 2003/0164814 A1 | 9/2003 | Starkweather et al. | 345/102 |
| 2004/0218292 A1 | 11/2004 | Huibers | 359/850 |

FOREIGN PATENT DOCUMENTS

| | | |
|---|---|---|
| EP | 0774681 A1 | 5/1997 |
| EP | 0778657 A1 | 6/1997 |
| EP | 0 831 252 A2 | 3/1998 |
| EP | 1 201 602 A2 | 5/2002 |
| EP | 1 289 273 A1 | 3/2003 |
| EP | 1 341 025 A1 | 9/2003 |
| EP | 1 143 467 B1 | 9/2004 |
| FR | 2 703 475 | 10/1994 |
| FR | 2 749 693 | 12/1997 |
| JP | 10-39239 | 2/1998 |
| JP | 11-242180 A1 | 9/1999 |
| WO | WO 98/35258 | 8/1998 |
| WO | WO 99/36825 | 7/1999 |
| WO | WO 00/67268 | 11/2000 |
| WO | WO 00/73839 A1 | 12/2000 |
| WO | WO 01/42844 A2 | 6/2001 |
| WO | WO 01/45120 A2 | 6/2001 |
| WO | WO 01/84531 A1 | 11/2001 |

OTHER PUBLICATIONS

Chang, C. et al., "Innovative Micromachined Microwave Switch with Very Low Insertion Loss", *Sensors and Actuators*, 2000, 71-75.

Chen, R.T. et al., "A Low Voltage Micromachined Optical Switch by Stress-Induced Bending", *Micro Electro Mechanical Systems*, 1999, 424-428, XP 010321766.

Chiao, M. et al., "Self-Buckling of Micromachined Beams Under Resistive Heating", *Journal of Microelectrochemical Systems*, Mar. 2000, 9(1), 1057-7157.

Hagelin, P.M. et al., "Optical Raster-Scanning Displays Based on Syrface-Micromachines Polysilicon Mirrors", *IEEE Journal of Selected Topics in Quantum Electronics*, Jan. 1999, 5(1), 67-74 XP000823390.

Lee, J.Y. et al., "A Characterization of the Thermal Parameters of Thermally Driven Polysilicon Microbridge Actuators Using Electrical Impedance Analysis", *Sensors and Actuators*, May 1999, 75(1)(4), 86-92, XP004147068.

Miller, D.C. et al., "Micromachined, Flip-Chip Assembled, Actuatable Contacts for Use in High density Interconnection in Electronics Packaging", *Sensors and Actuators*, 2001, 89, 76-87.

Noworolski, J.Mark. et al., "Process for In-Plane and Out-of-Plane Single-Crystal-Silicon thermal Microactuators", *Sensors and Actuators*, 1996, 55, 65-69.

Seki, T. et al., "Thermal Buckling Actuator for Micro Relays", *Transducers*, 1997, 1153-1156.

Sinclair, M.J., "1D and 2D Scanning Mirrors Using Thermal Buckle-Beam Actuation", *Proceedings of the SPIE*, Dec. 2001, 4592(17), 307-314, XP 009019263.

Sinclair, M.J., "A High Force Low Area MEMS Thermal Actuator", *The 7th Intersociety Conference on Thermal and Thermomechanical Phenomena in Electronic Systems*, May 2000, 127-132, XP010510393.

Sinclair, M. "A High Frequency Resonant Scanner Using Thermal Actuation", *Technical Digest, 15th International Conference on Micro Electro Mechanical Systems*, Jan. 2002, 698-701.

* cited by examiner

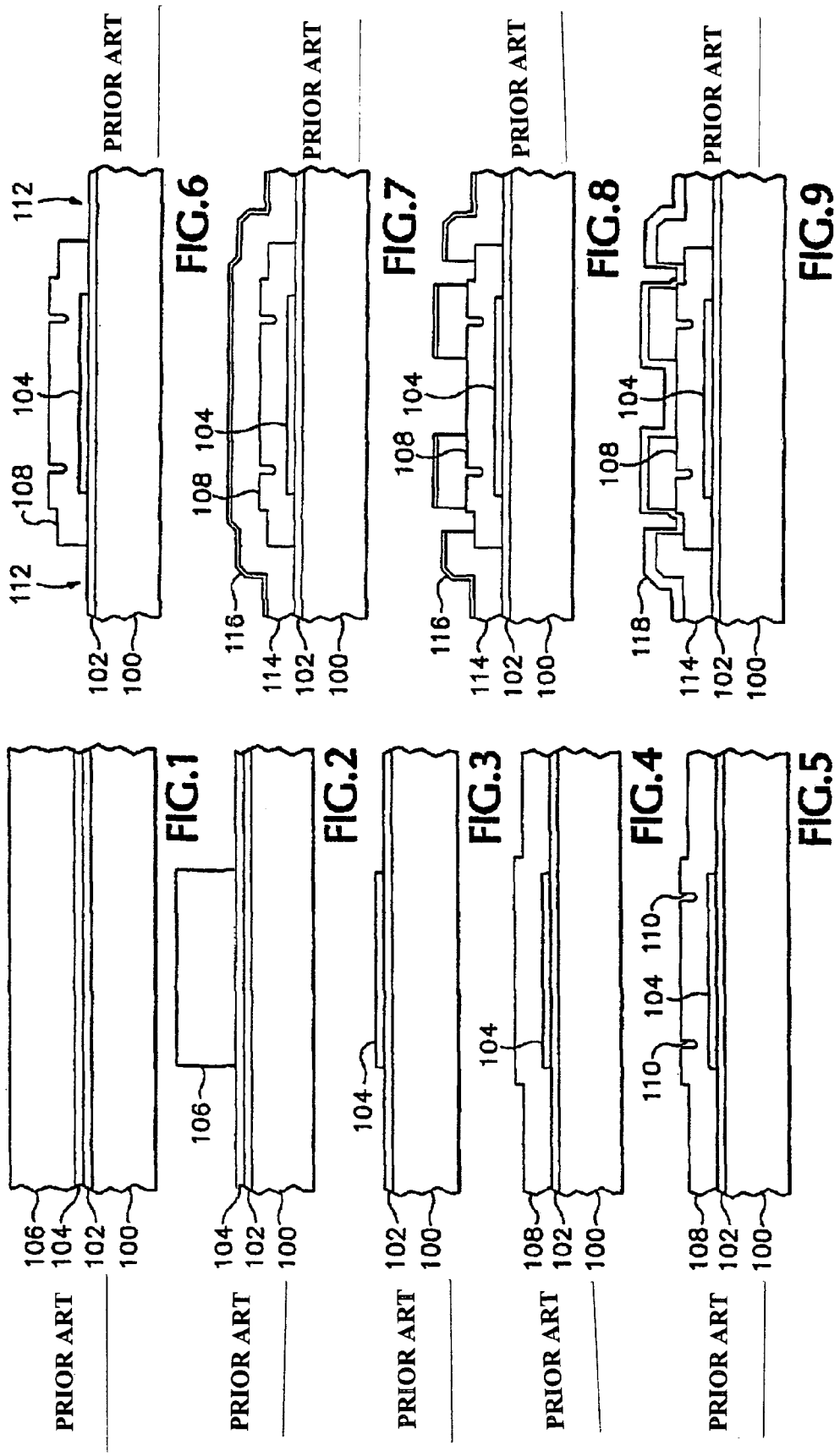

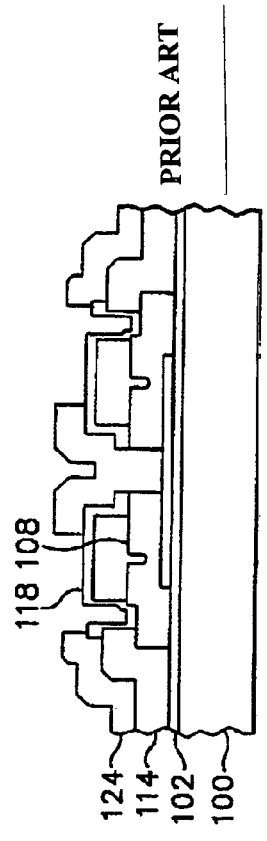
FIG. 10 PRIOR ART
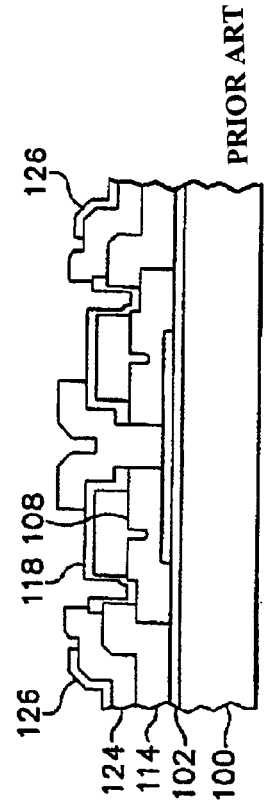
FIG. 11 PRIOR ART
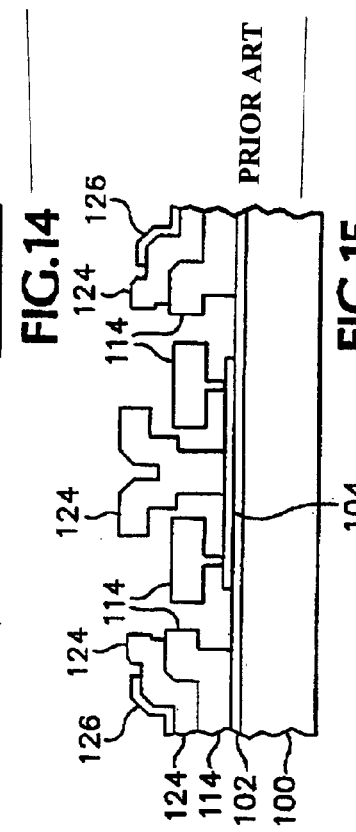
FIG. 12 PRIOR ART
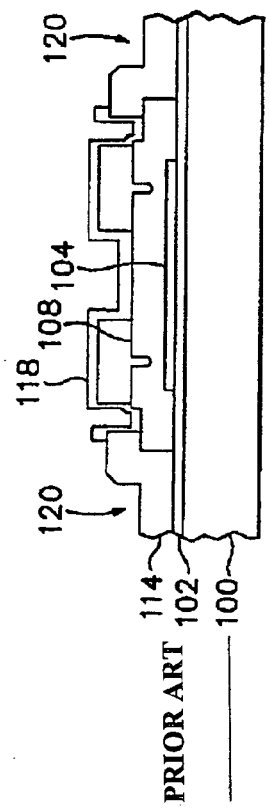
FIG. 13 PRIOR ART
FIG. 14 PRIOR ART
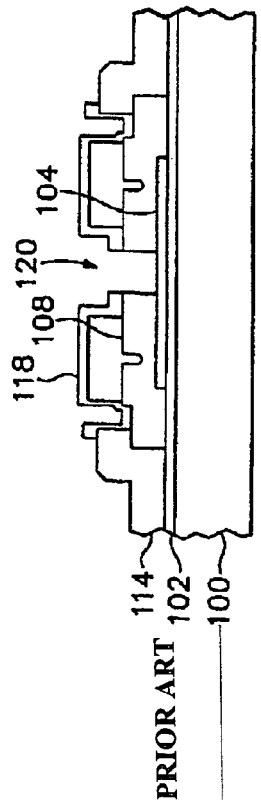
FIG. 15 PRIOR ART

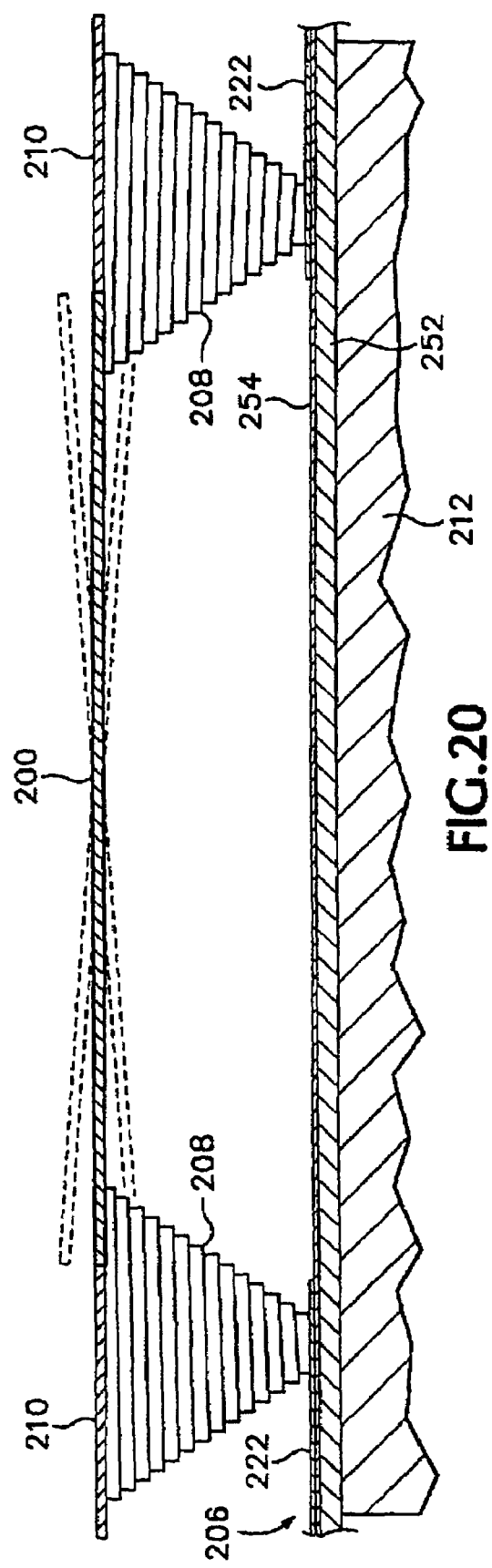

MAGNETICALLY ACTUATED MICROELECTROCHEMICAL SYSTEMS ACTUATOR

BACKGROUND OF THE INVENTION

1. Field of the Invention

This invention pertains to electrically controlled actuators and more particularly pertains to microelectromechanical systems (MEMS) actuators.

2. Description of the Related Art

Electrically controlled actuators receive electrical signal input and provide a mechanical output that can be used to move objects. The electrical signal can control the mechanical output to control a rate and amount of movement applied to the object. Large, electrically controlled actuators are common in mechanical systems to control valves, pumps, and move objects.

Recent innovations require control of very small components. In U.S. Pat. No. 5,808,384 a photolithographic process is used to fabricate a micromechanical actuator to control switches, relays, and valves. However, the invention of the U.S. Pat. No. 5,808,384 does not teach a means to move objects toward and away from the plane of the substrate upon which the device is formed.

In U.S. Pat. No. 5,867,297 the inventor discloses a microelectrical mechanical device to oscillate a mirror for deflecting a laser beam to read bar codes. The mirror is substantially upright and moved about a hinge connection to the substrate on which it is formed, but the device relies upon staples and hinges, which have proven unreliable. In addition, the mirror is hinged to the substrate and is constrained to move in rotation about a single axis, thereby limiting its utility. Also, some applications require a mirror that is parallel to the substrate on which is formed, a design imitation that can not be accommodated by U.S. Pat. No. 5,867,297.

Currently, many applications seek to control a mirror surface to control light energy and move light beams in order to scan bar codes or create and project video images.

In U.S. Pat. No. 5,192,946 a spatial light modulator includes an array of mirrors that are used to create and project a video image onto a screen. The video image is created by directing light onto the mirror array (referred to in U.S. Pat. No. 5,192,946 as a deformable mirror device) and controlling an orientation of the individual mirrors in order to control a path of the light. The screen image comprises many pixel elements that correspond to individual mirrors in the array. Each pixel element is turned on and off by controlling the orientation of the mirrors to reflect the light onto the screen (or intermediate lenses) or away from the screen. The mirror array includes mirrors formed on a semiconductor substrate that are hinged to move between up and down positions in which the light is reflected toward or away from the screen in order to toggle on and off, respectively, the pixel element displayed on the screen. The individual hinged mirrors can only be rotated about one axis, providing only one degree of motion that limits projector design. Such video image systems are also referred to as digital light processors (DLP).

In order for such video systems to be viable, the mirror arrays must be easy and inexpensive to fabricate in quantity and provide controllable, high speed movement of the mirrors. Another important criteria is that the mirror actuation means be very reliable. In many designs, semiconductor hinges have proven to have lower reliability than desired mainly because of stiction and abrasion problems. In addition, it is desirable that the mirrors of the mirror array can be moved a sufficient range of motion and freedom of movement to accommodate projector designs. Accordingly, where other factors are equal, actuators that can move mirror in 2 or 3 degrees of motion and with a range of motion of ±30 degrees about an axis of rotation is preferred to an actuator system that can move a mirror a maximum of ±10 degrees in only one degree of motion.

SUMMARY OF THE INVENTION

The present invention provides a microelectromechanical actuator that receives electrical input and provides a mechanical output to controllably move an object, such as a mirror in a mirror array. In a first preferred embodiment, the electrical input is conducted along coils creating a magnetic field, such as occurs in an energized solenoid coil. A second magnetic field is provided by a second source, such as a permanent magnet, and the two magnetic fields are arranged in opposing orientation so that a repulsion force is created that moves a portion of the coil. The coil can thus be coupled to an edge of a mirror to controllably move the mirror. The mirror may be mounted on a plurality of actuators to provide 3 degree-of-freedom motion: about two axes of rotation and linearly along a longitudinal axis of the actuators.

In a first embodiment of the invention, pairs of dual interspersed coils (preferably, Archimedean spirals) are located side-by-side and coupled together by a conducting bridge element. The first and second coils of the coil pair are wound in opposite directions. That is, the first coil proceeds clockwise, and the second coil proceeds counterclockwise, from their respective centers. Current is then conducted from the first coil center to an outermost portion of the first coil and then conducted by the bridge to an outermost portion of the second coil. The current is then conducted along the second coil to its innermost portion. Thus, the current proceeds in the same direction, i.e., clockwise or counterclockwise, through both coils and the magnetic field is oriented in the same direction through both coils. The magnetic fields of the coils are thereby aligned to provided a repulsive force to the second magnetic field.

Preferred embodiments of the actuators are fabricated by a general fabrication process known in the art as Multi-User MEMS Processes (MUMPs), which is described in greater detail below. In one preferred embodiment, four actuators are formed on a substrate as portions of one layer and the bridges and mirror are formed as portions of another mirror. The actuators are located at each of four corners of the mirror, which is rectangular. The mirror is coupled to the actuators by the bridges and sits atop the actuators. Extension of the actuators thus moves the mirror up and down, or away from and toward the substrate, respectively. Pairs of actuators may be extended to rotate the mirror about an axis of rotation. Selection of the actuators to extend, permit movement of the mirror about orthogonal bisecting axes of rotation or along a diagonal axis of rotation.

A limitation of the MUMPs fabrication process is that layers that are physically connected are also electrically conductive. And, in the preferred embodiments, the actuator coils, the bridge, and the mirror are physically coupled and thus electrically conductive. Accordingly, symmetric bipolar current is applied to the coil pairs to maintain the mirror at zero volts and prevent cross-talk and excessive and possibly damaging current between the coils.

The actuator of the present invention is fabricated in conformal layers as described below in connection with the MUMPs process. Accordingly, the actuators, bridges, and mirror are formed as layers that are close to one another. Therefore, in order to provide a desired range of motion, a steady-state elevating current is applied to the actuators that creates a substantially similar magnetic field in each actuator to extend each actuator a similar amount and raise the mirror above (i.e., away from) the substrate on which the components are formed. The mirror may then be moved by providing a modulation current to individual actuators that increases or decreases the magnetic field strength in those particular actuators, to raise or lower one corner, or side, of the mirror relative to the other mirror portions. In this manner, a mirror may be tilted to control a path of a light beam to form a portion of a video image. Alternatively, actuators of the present invention fabricated by means other than MUMPs, may provide for electrical separation between the coils and the mirror and thereby simplify the arrangement of coils in the actuator.

In alternative embodiments, the actuator coils may be configured to provide a specific range of motion for particular applications. The coils may be provided with a greater or lesser number of coil turns or a cross-sectional area of the coils may be increased or decreased.

Alternatively, a single actuator having a single coil may be used on a mirror that is hingedly mounted to a support surface to provide a single degree of motion as desired by some applications.

In further alternative embodiments, the second, repulsive magnetic force may be provided by an electromagnet coil formed on the substrate that supports the actuators and the mirror. Alternatively, the second magnetic force may be provided by an electromagnet coil formed on a second substrate and be positioned in close proximity to the substrate having the actuators and mirror located thereon.

Also, in another alternative embodiment, the expanding/moving coils may be formed of a magnetic material and the repulsive magnetic force may be supplied by an electromagnet semiconductor coil formed on the substrate. The magnetic coils of this embodiment may be formed by electrodeposition or sputtered application of a ferromagnetic material. The electromagnet semiconductor coil may be formed on an obverse or reverse side of the substrate, or on an additional substrate that is located proximate the substrate that supports the magnetic coils and mirror.

The preferred embodiment of the invention is shown in the context of supporting, and controllably moving, a mirror. As stated, control of microelectrical mechanical mirror systems is finding substantial application in spatial light modulators (digital light processors) that require fast, controllable movement of mirrors. However, the actuators of the present invention also have application in other microelectrical mechanical systems that may require movement of other objects such as lenses, valves, and gears.

As stated, the actuators of the preferred embodiments are fabricated by a commercially available process known as MUMPs. The MUMPs process is not a part of the present invention. However, application of the MUMPs process to fabricate the present invention, and the steps performed, masks used, structure of the layers, and steps omitted is novel and may form a part of the present invention.

Overview of the MUMPs Fabrication Process.

To assist with understanding the present invention, the general procedure for fabricating micromechanical devices using the MUMPs process is explained with reference to FIGS. 1–15.

The MUMPs process provides three-layers of conformal polysilicon that are etched to create a desired physical structure. The accompanying figures show a general process for building a micro-motor as provided by the MEMS Technology Applications Center, 3021 Cornwallis Road, Research Triangle Park, N.C.

The MUMPs process begins with 100 mm n-type silicon wafer 100 of 1–2 Ω-cm resistivity. The wafer surface is heavily doped with phosphorus in a standard diffusion furnace using POCl 3 as the dopant source. This reduces, or even prevents, charge feed through to the silicon from electrostatic devices subsequently mounted on the wafer. Next, a 600 nm low-stress LPCVD (low pressure chemical vapor deposition) silicon nitride layer 102 is deposited on the silicon as an electrical isolation layer. The silicon wafer and silicon nitride layer form a substrate.

Next, a 500 nm LPCVD polysilicon film—POLY 0 104—is deposited onto the substrate. The POLY 0 layer 104 is patterned by photolithography; a process that includes coating the POLY 0 layer with a photoresist 106, exposing the photoresist with a mask (not shown) and developing the exposed photoresist to create the desired etch mask for subsequent pattern transfer into the underlying layer (FIG. 2). After patterning the photoresist, the POLY 0 layer 104 is etched in an RIE (Reactive Ion Etch) system (FIG. 3).

As shown in FIG. 4, a 2.0 μm phosphosilicate glass (PSG) sacrificial layer 108 is deposited by LPCVD onto the POLY 0 layer 104 and exposed portions of the nitride layer 102. This PSG layer, referred to herein as First Oxide, is removed at the end of the process to free the first mechanical layer of polysilicon, POLY 1 (described below) from its underlying structure; namely, POLY 0 and the silicon nitride layers. This sacrificial layer is lithographically patterned with a DIMPLES mask to form dimples 110 in the sacrificial PSG layer by RIE (FIG. 5) at a depth of 750 nm. The wafer is then patterned with a third mask layer, ANCHOR1, and reactive ion etched (FIG. 6) to provide anchor holes 112 that extend to the POLY 0 layer. The ANCHOR 1 holes will be filled in the next step by the POLY 1 layer 114.

After the ANCHOR1 etch, a first structural layer of polysilicon (POLY 1) 114 is deposited at a thickness of 2.0 μm. A thin 200 nm PSG layer 116 is deposited over the POLY 1 layer 114 and the wafer is annealed at 1050° C. for 1 hour (FIG. 7). The anneal dopes the POLY 1 layer with phosphorus from the PSG layers both above and below it. The anneal also serves to significantly reduce the net stress in the POLY 1 layer. The POLY 1 and PSG masking layers are lithographically patterned using a mask designed to form the structure of the POLY1 layer. The PSG layer is etched to produce a hard mask for the subsequent polysilicon etch. This hard mask is more resistant to the polysilicon etch chemistry than the photoresist and ensures a better transfer of the pattern into the POLY 1 layer. After etching the POLY 1 layer (FIG. 8), the photoresist is stripped and the remaining oxide hard mask is removed by RIE.

After the POLY 1 layer 114 is etched, a second PSG layer (Second. Oxide) 118 is deposited (FIG. 9). The Second Oxide is patterned using two different etch masks with different objectives.

First, a POLY1_POLY2_VIA etch (depicted at 120) provides for etch holes in the Second Oxide down to the POLY 1 layer. This etch provide a mechanical and electrical connection between the POLY 1 layer and a subsequent POLY 2 layer. The POLY1_POLY2_VIA layer is lithographically patterned and etched by RIE (FIG. 10).

Second, an ANCHOR2 etch (depicted at 122) is provided to etch both the First and Second Oxide layers 108, 118 in one step to eliminate misalignment that can occur between separately etched holes. More importantly, the ANCHOR2 etch eliminates the need to make a cut in the First Oxide layer that is unrelated to anchoring a POLY 1 structure, which would needlessly expose the substrate to subsequent processing that can damage either the POLY 0 or Nitride layers. For the ANCHOR2 etch, the Second Oxide layer is lithographically patterned and etched by RIE in the same way as the POLY1_POLY2_VIA etch. FIG. 11 shows the wafer cross section after both POLY1_POLY2_VIA and ANCHOR2 etches have been completed.

A second structural layer, POLY 2, 124 is then deposited (1.5 µm thick) followed by the deposition of 200 nm PSG. As with the POLY 1 layer, the thin PSG layer acts as both an etch mask and dopant source for the POLY 2 layer (FIG. 12). The wafer is then annealed for one hour at 1050° C. to dope the polysilicon of the POLY 2 layer and reduce its residual film stress. The POLY 2 layer is lithographically patterned with a seventh mask and the PSG and polysilicon layers are etched by RIE using the same processing conditions as for the POLY 1 layer. The photoresist then is stripped and the masking oxide is removed (FIG. 13).

The final deposited layer in the MUMPs process is a 0.5 µm metal layer 126 that provides for probing, bonding, electrical routing and highly reflective mirror surfaces. The wafer is patterned lithographically with the eighth mask and the metal is deposited and patterned using lift-off. The final, unreleased exemplary structure is shown in FIG. 14.

Lastly, the wafers undergo sacrificial release and test. The release is performed by immersing the device in a bath of 49% HF (at room temperature) for 1.5–2 minutes. This is followed by several minutes in DI water and then alcohol to reduce stiction followed by at least 10 minutes in an oven at 110 C. FIG. 15 shows the device after sacrificial oxide release.

In preferred embodiments, the device of the present invention is fabricated by the MUMPs process and is subjected to the steps of the commercial process described above. However, the device of the present invention does not employ the specific masks shown in the general process of FIGS. 1–15, but rather employs masks for the structure of the present invention in accordance with the detailed description provided below. Also, the steps described above for the MUMPs process may change as dictated by the MEMS Technology Applications Center. The fabrication process is not a part of the present invention and is only one of several process that can be used to make the present invention.

BRIEF DESCRIPTION OF THE DRAWINGS

FIGS. 1–15 are cross-section views of a general multi-user MEMS process known in the prior art for fabricating microelectrical mechanical devices. Cross-hatching is omitted to improve clarity of the prior art structure and process depicted.

FIG. 20 is an enlarged elevation view of actuators of the present invention shown extended under the force of magnetic fields and showing movement of the mirror in phantom.

DESCRIPTION OF THE PREFERRED EMBODIMENTS

Figure 16:
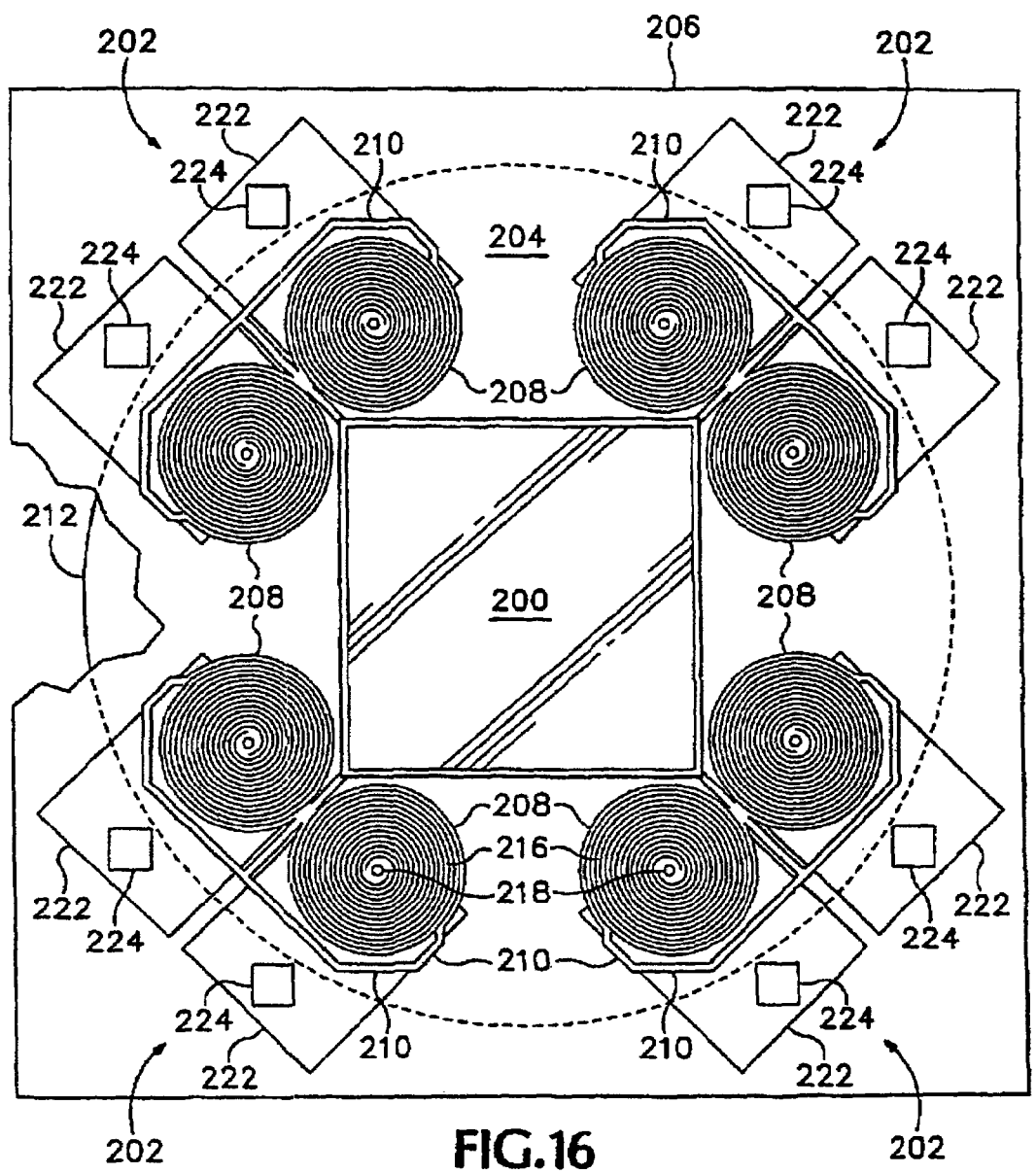
FIG. 16 is a top plan view of a preferred embodiment of electrically-controlled, magnetically-actuated actuators of the present invention arranged on a substrate so as to move a centrally located mirror.

A preferred embodiment of the present invention is described below with reference to the accompanying FIGS. 16–20. The present invention provides an electrically controlled actuator. While the present actuator is shown controlling a mirror surface—a common application of microelectrical mechanical actuators—the actuator may be used to control other physical structures, such as lenses, valves, and switches.

In the present invention, a repulsive magnetic force is used to elevate and control an orientation of the mirror, or other object. In a first preferred embodiment, electrical input is provided to expandable, semiconductor coils to create a variable magnetic field. A permanent magnet located near the semiconductor coils provides an opposing fixed magnetic force that causes the semiconductor coils to expand in a predictable and controllable manner. This coil expansion provides mechanical motion that can move an object such as the exemplary mirror. The electrical input may be controlled to vary the magnetic field, and hence the repulsive magnetic force, to control the orientation of the mirror.

In an alternative embodiment, the mirror is supported by expanding coils that are fabricated of a magnetic material. The repulsive magnetic force is created by an electromagnetic coil that is located on, or near, a substrate that supports the expanding coils. In this embodiment, the expanding, coils are not connected to an electrical power source. Rather, the expanding coils are magnetic, acting as permanent magnets having a north-south polarization. The electromagnetic coil provides a variable magnetic field whose orientation is determined by a direction of current flow in the electromagnetic coil, and the orientation is chosen so as to provide a repulsive magnetic force to the polarization of the expanding, magnetic coils. The magnitude of the current in the electromagnet coil determines the magnitude of the repulsive magnetic force and is controlled to the control the orientation of the mirror.

Below, the first preferred embodiment is described in detail, and alternatives are later described in terms of differences with the first preferred embodiment.

Mirror Actuator System

In the first preferred embodiment of the invention, a mirror 200 is supported by four actuators 202 above an obverse side 204 of a planar substrate 206. Each actuator includes two coils 208 arranged substantially side-by-side near the mirror. A bridge 210 couples the coils together, and couples the coils to the mirror. A permanent magnet 212 is coupled to a reverse side 214 of the substrate by conventional means such as adhesive.

Each coil 208 of each actuator 202 includes two interspersed, Archimedean spirals 216a and 216b (FIG. 17) (collectively, spirals 216). In a given actuator, at a fixed vantage point, the spirals 216 of one coil follow a clockwise path from a radially innermost portion 218 of the coil to a radially outermost portion 220 of the coil, and the spirals 216 of the other coil of the actuator follow a counterclockwise path from the radially innermost portion to the radially outermost portion. From the vantage of FIG. 17, the coil designated as 208a is clockwise (CW) and the coil designated as 208b is counterclockwise (CCW).

The radially innermost portion 218 of each coil (i.e., the center portion) is anchored to a semiconductor platform 222 that includes a metal probe pad 224 for electrical probing and as a location for electrical connection of the coils to a source of electrical energy as described in greater detail below. The probe pads 224 are in electrical communication with the spirals 216 of each coil via the semiconductor platform 222. Specific platforms and pads are referred to herein by adding a letter designation after the numeric designation: thus, in FIGS. 17 and 18, platforms 222a and 222b, and pads 224a and 224b are depicted.

The radially outermost portions 220 of the coils 208 are directly coupled only to the bridge 210. Because the semiconductor coils 208 are flexible, the radially outermost portions 220 can extend upward, away from the obverse surface 204 of the substrate 206. When the radially outermost portions 220 are extended upward, the connected bridge 210 and mirror 200 necessarily follow, and are likewise moved upward.

Figure 18:
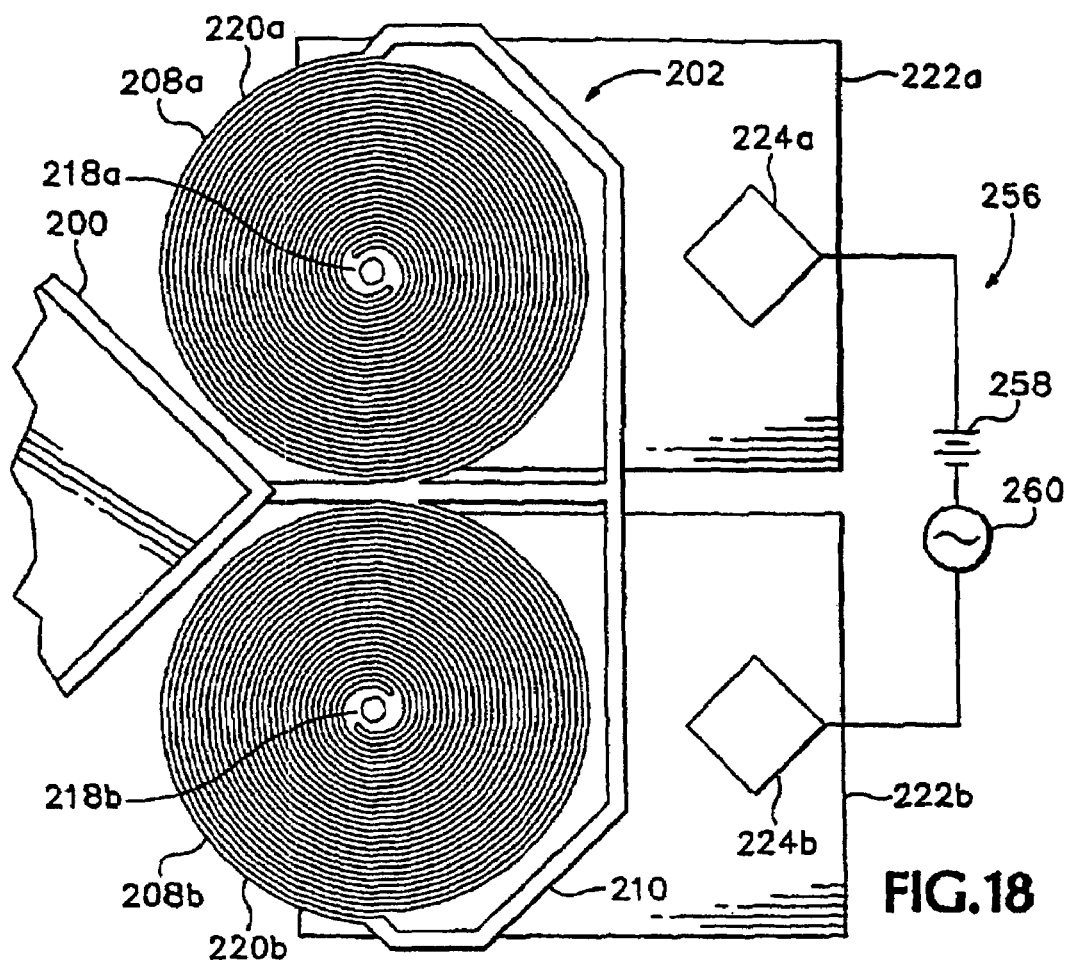
FIG. 18 is a schematic representation of a preferred embodiment of the actuator of the present invention coupled to electrical current sources.

With reference to FIG. 18, a steady-state electrical potential source 258 applied across the probe pads 224a and 224b creates an electrical current that is conducted from the steady-state source to the center 218a of one coil 208a (when the potential at 218a is greater than 218b). The current path proceeds clockwise along the spirals of coil 208a to the outermost portion 220 of coil 208a. From coil 208a, the current is conducted by the bridge 210 to the outermost portion of coil 208b whence the current is conducted clockwise along the spirals 216 of coil 208b to the innermost portion 214 of the coil 208b and to the probe pad 218b. Thus, as viewed in plan in FIG. 18, the current proceeds clockwise through each coil.

The current passing through each coil 208a and 208b creates a magnetic field $B_c$, (FIG. 19) defining lines of magnetic flux that are oriented substantially orthogonal to the plane of the substrate 206. And, because the coils are oppositely wound forcing the current to proceed in a like direction through each coil, the directions of the magnetic fields of each coil are equal.

The magnet 212 also establishes a magnetic field $B_m$ defining lines of magnetic flux that are substantially orthogonal to the substrate 206. The magnetic polarity of the magnet and the magnetic flux in the coils are arranged to be substantially opposed. Thus, the magnetic flux within the coils creates a repulsion force to the magnetic flux of the magnet and the coils are urged to extend so that the radially outermost portions 220 of the coils move upward away from the substrate and thus lift the bridge 210 and mirror 200 above the substrate. The current may be modulated to increase and decrease current in the coils so as to increase and decrease the magnetic flux density (i.e., the strength of the magnetic repulsive force) thereby controlling the amount of coil extension and moving the mirror, or a portion thereof, toward and away from the substrate.

By controlling the current in each actuator 202, the mirror 200 can be raised, lowered, or tilted along diagonal and bisecting axes. Thus, for example, two actuators may be raised or lowered simultaneously so as to raise or lower one side of the mirror relative to its opposing side. When light is reflected by the mirror, movement of the actuators moves the reflected light beam. Accordingly, the actuators may be controlled to move the mirror to control a light beam path.

As explained in greater detail below, the mirror is a semiconductor with a metal surface and thus conducts current. Further, under the current MUMPs fabrication process, the mirror cannot be electrically isolated from the coils 208 and bridge 210. Thus, current applied to one coil of one actuator would be conducted to each actuator having a coil at a lower potential. Instead, a bipolar current is applied to the actuators that maintains the mirror at zero potential and eliminates cross talk between actuators.

The above description provides an exemplary overview of a plurality of actuators 202 arranged to support and controllably move the mirror. In the following description the actuator 202 is described in greater detail.

Actuator

Figure 17:
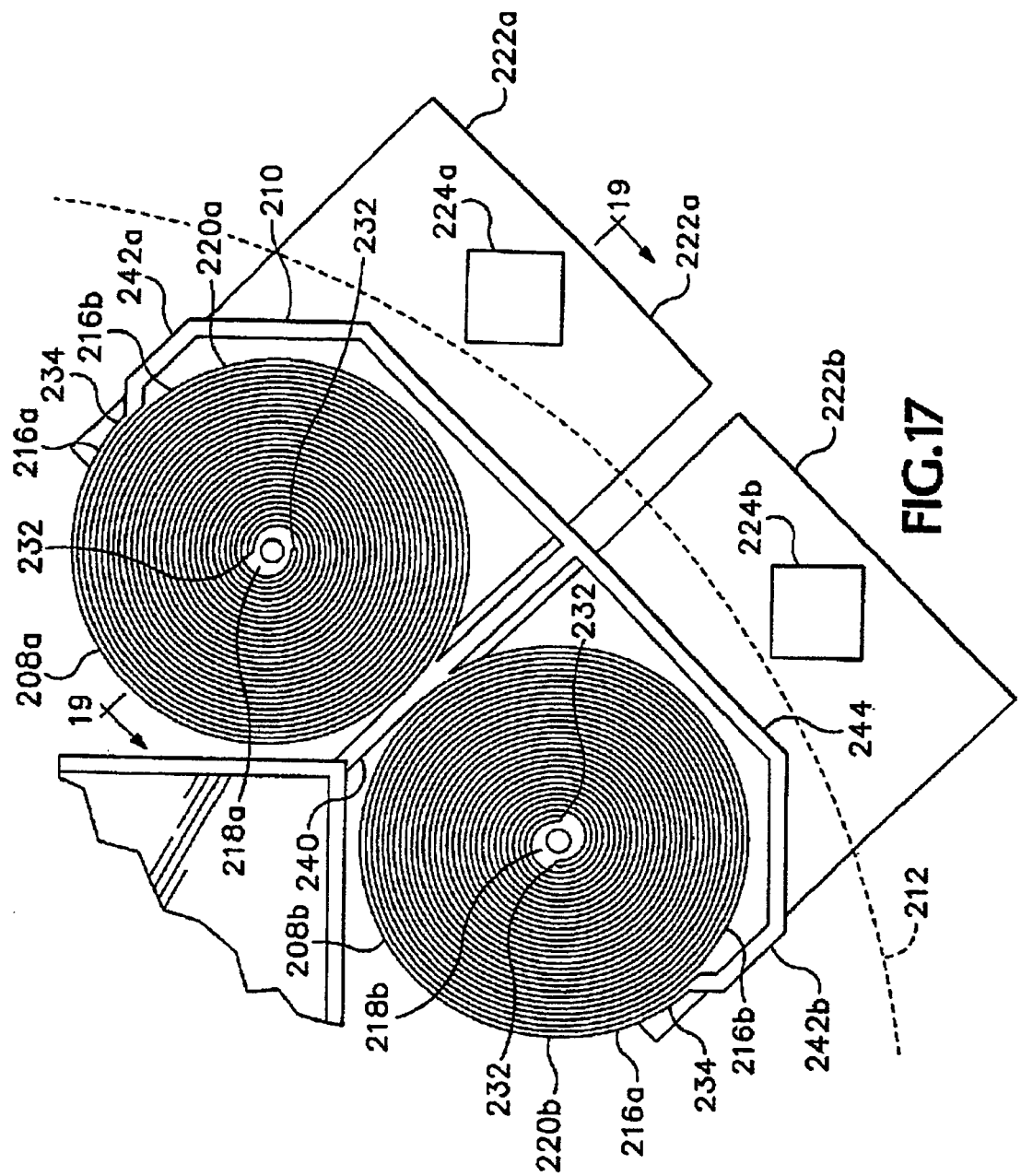
FIG. 17 is an enlarged top plan view of the actuator of the present invention shown coupled to a margin of a mirror.
Figure 19:
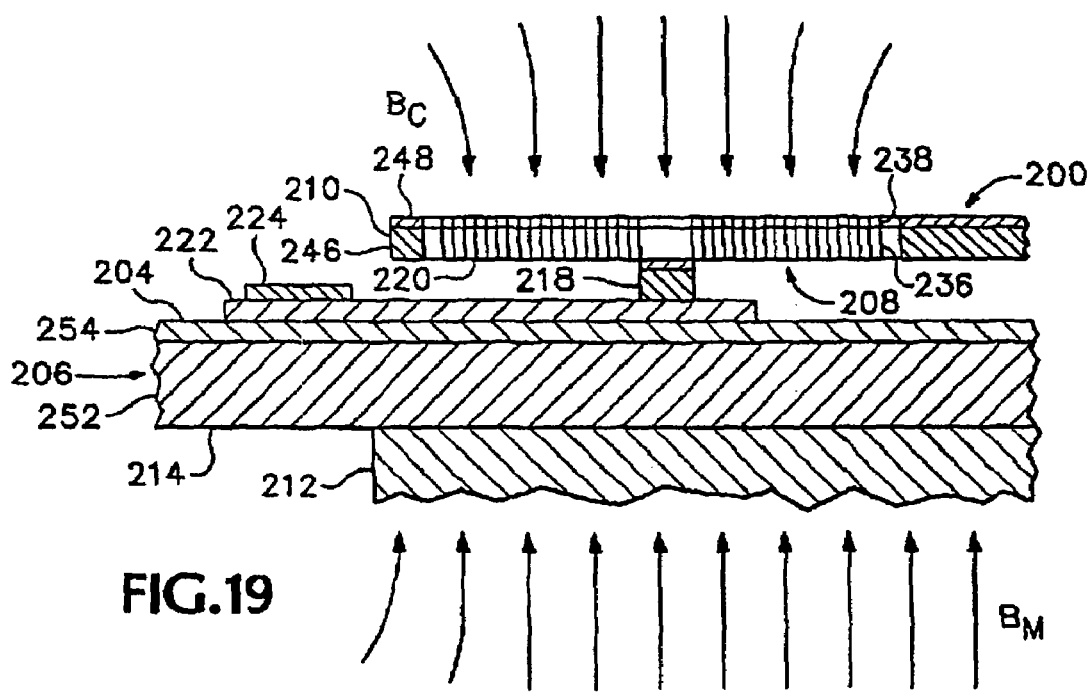
FIG. 19 is a an enlarged cross-section view of the actuator of the present invention as viewed along line 19—19 of FIG. 17.

With particular reference to FIGS. 17–19, a preferred embodiment of the actuators 202 is described in greater detail. As stated, each actuator includes two coils 208. The coils 208 include the dual spirals 216 that are interspersed, Archimedean spirals having a proximal end 232 at the radially innermost portion 218 of the coil and a distal end 234 at the radially outermost portion 220 of the coil. The proximal ends 232 of the spirals are coupled to the platform 222 and the spirals follow a path of an Archimedean spiral ($r = A\theta$, where r=radius, A=a constant, and $\theta$=angle in polar coordinates) from the proximal ends to the distal ends 234. The respective coils have opposed spiral windings, that is the spirals of coil 208a (when viewed in plan as in FIGS. 17 and 18) follow a clockwise path proceeding from the proximal ends to the distal ends and the spirals of coil 208b follow a counterclockwise path proceeding from the proximal ends to the distal ends.

As stated the spirals of each coil are interspersed. In the preferred embodiments of FIGS. 17 and 18, the proximal ends 232 of the two spirals are located approximately 180 degrees apart at the radially innermost portion 218 of the coil. From this 180 degree initial orientation, the spirals of a given coil follow the path of the Archimedean curve and radially overlap the other spiral as they proceed along the path. Stated differently, except at the innermost and outmost portions, each spiral portion is surrounded by corresponding portions of the other spiral so that for a given portion of a first spiral, e.g., 216a, a second spiral 216b is adjacent radially inward and radially outward. The distal ends 234 of each spiral, in each coil, terminate approximately 180 degrees apart at the radially outermost portion of the coil.

In cross-section, the coil spirals 216 include a semiconductor layer 236 (FIG. 19) and a metal surface layer 238 that provides a low resistance path for current. The coil spirals are flexible and can extend—that is, the coil outermost portion 220 can move relative to the innermost portion 218 to extend the coil to resemble a wound conical spring. Because the proximal ends 232 are coupled to the platforms 222, only the outermost portions of the coil can extend away from the substrate 206. When formed, and when no current flows in the coils, the coils lie as spirals in a plane as depicted in FIG. 19, and when extended, the coils form an inverted conical helix-type shape that is generally parabolic in vertical cross-section, substantially as depicted in FIG. 20. In the present context, "helix" refers to the overall shape of the extended coils that results from raising the outmost portions of the spirals 216 above the substrate 206. When so extended, a smooth curve along the outermost points of a vertical cross-section of the extended coil is substantially parabolic. The curve of the cross section may be different in the various embodiments. Nonetheless, the term "helix" is meant to cover all embodiments of the present invention in which a spiral is extended, or outstretched.

The bridge 210 is "E" shaped in plan view, having a center leg 240 that is coupled to the mirror. The center leg is also coupled to distal ends 234 of spiral 216a of each coil 208a and 208b. Bridge distal legs 242a and 242b extend from a bridge back 244 and are coupled to distal ends 234 of the spiral 216b of each coil 208a and 208b. The bridge is formed of a metalized semiconductor layer 246 and a highly conductive metal surface layer 248 (FIG. 19). Because the bridge is coupled to the distal ends of each spiral of both coils of a single actuator, the bridge conducts current between the coils when the electrical potential of one coil is greater than the electrical potential of the other coil.

With reference to the MUMPs process described above, the structure of the actuator of the present invention in further described in connection with its fabrication with particular reference to FIG. 19. A 100 mm n-type silicon wafer 252 is heavily doped with phosphorus and a 600 nm silicon nitride layer 254 is deposited on the silicon wafer 252 as an electrical isolation layer, thereby forming the substrate 206. The silicon nitride layer is followed directly by deposition of the POLY 0 (the layers POLY 0, POLY 1, and POLY 2 are not labeled; only the structures formed by deposition and etching are shown and labeled).

The POLY 0 layer is photolithographically patterned with a photoresist, exposed, and developed to create the semiconductor coil platforms 222. After patterning the photoresist, the POLY 0 layer is etched in a reactive ion etch system.

The FIRST OXIDE layer is deposited onto the POLY 0 layer and exposed portions of the nitride layer 254. As stated, this First Oxide layer is removed at the end of the process to free the subsequent mechanical layers comprising the coils, bridge, and mirror. After application of the First Oxide layer, the wafer is patterned with the ANCHOR1 mask layer and reactive ion etched to provide anchor holes down to the platforms 222 that will be filled in by the POLY 1 layer in the next step.

The POLY 1 layer is next applied at a thickness of 2.0 μm. This layer is the first structural layer of the device. After etching and release, this layer forms the coils 208 of the actuators 202. The anchor holes formed above provide means to anchor the radially innermost portions 218 of the coils to the platforms 222. A thin 200 nm phosphosilicate glass masking layer is deposited over the POLY 1 layer and other exposed layers and the wafer is annealed.

The POLY 1 and phosphosilicate glass masking layer are lithographically patterned using a mask that defines the coils 208. After etching the POLY 1 layer, the photoresist is stripped and the remaining oxide hard mask is removed by reactive ion etch.

Next, the Second Oxide is deposited and patterned using one of the two etch masks in the MUMPs process.

The POLY1_POLY2_VIA etch provides for etch holes in the Second Oxide down to the POLY 1 layer. This etch provides a mechanical and electrical connection between the POLY 1 layer and the subsequent POLY 2 layer. In terms of the present invention, this etch is used to provide a mechanical and electrical connection between the coils (formed by the POLY 1 layer) and the bridge (formed by the POLY 2 layer).

The second structural layer, POLY 2, is then deposited on the wafer along with a 200 nm phosphosilicate glass layer, and then annealed to dope the polysilicon and reduce the film stress. The POLY 2 layer is lithographically patterned with a seventh mask to form the bridge 210 and mirror 200 structures.

The final deposited layer is a 0.5 μm metal layer that provides for the probe pads 224, the electrically conductive layers on the coils and bridges, and a highly reflective surface for the mirror. Lastly, the device undergoes sacrificial release to free the coils 208 from the platforms 222, except where the radially innermost portions 218 are anchored to the platforms.

In FIG. 18, the actuator 202 is shown schematically coupled to a circuit 256 having two sources of electrical energy: the elevating current source 258 and a modulating current source 260. The elevating current source provides steady-state current that is conducted through the coils creating the magnetic field Bc (FIG. 19). The strength of the magnetic field is proportional to the product of the current, the number of coil turns, and the cross-sectional area of the coil spirals. The coil magnetic field $B_c$ has a polarity, represented in FIG. 19 as directed into the substrate 206. For a given design, the number of coil turns and the cross-sectional area of the spirals is fixed. Thus, the strength of the magnetic field is proportional to the current and can be modulated by changing the current.

The elevating current source 258 provides steady-state current that creates a steady-state magnetic field $B_c$. The magnetic field $B_c$ is opposed by the magnetic field $B_m$ of the permanent magnet 212 and the coil 208 is urged to expand, thereby raising the mirror above the substrate 206. The distance of the mirror away from the substrate is governed by the strength of the magnetic fields $B_c$ and $B_m$.

The elevating current raises the mirror approximately 100 to 500 μm above the substrate to provide sufficient space between the mirror and the substrate for a desirable range of motion for the mirror. By raising the mirror above the substrate, the present invention can tilt the mirror more than thirty degrees away from parallel to the substrate surface. Some prior art devices that control mirror movement can move its mirror by only 10 degrees before the mirror contacts underlying structure. Because the present invention elevates the mirror away from the substrate, a greater angle of deflection can be realized.

FIG. 18 depicts only one actuator connected to one elevating current for purposes of explanation. However, to use the actuators of the present invention to control a mirror as depicted in FIG. 16 includes four actuators. Each actuator may receive an identical elevating current to elevate the mirror above, and parallel to, the planar surface of the substrate. To provide identical elevating currents to each of four actuators, the substrate may include additional circuits so that each actuator is coupled to the same elevating current supply source. In alternative embodiments, the elevating current source is discrete for each actuator in order to maintain the mirror at a preferred orientation to the substrate.

After the elevating current is established and the mirror is elevated to a preferred height, the actuators may be individually controlled to raise and lower an edge or corner of the mirror by the control current source 260, which may be controlled by a digital processor (not shown) or other means known in the art. If feedback circuits are provided to calibrate, or otherwise control the actuators, the feedback circuit would control the modulating current source.

In FIG. 20, the coils 208 are shown extended so as to suspend the mirror 200 above the substrate 206. This side view shows the parabolic shape of the coils when the coils are in their extended state. When all the actuator coils are extended a similar amount, the mirror is held above, and substantially parallel to, the plane of the substrate. When the coils of one actuator are extended a greater amount than the coils of another actuator, by the means described above, the mirror is forced to tilt as shown in phantom.

ADDITIONAL ALTERNATIVE EMBODIMENTS

Portions of the description of the preferred embodiments refer to steps of the MUMPs fabrication process. However, as stated, MUMPs is a general fabrication process specifically provided for accommodating a wide range of MEMS device designs. Consequently, a different fabrication process that is specifically designed for the present invention will likely include different steps, additional steps, different dimensions and thickness, and different materials. Such specific fabrication processes are within the ken of persons skilled in the art of photolithographic processes and are not a part of the present invention.

In the preferred embodiments disclosed above, the magnet 212 is disclosed as coupled to the substrate 206, However, the magnet can also be mounted underneath a packaged chip having the actuators of the present invention, which alternative may provide easier packaging.

In the preferred embodiment, each coil includes dual interspersed spirals. However, each coil may include only one spiral or alternatively, each coil may have three or more interspersed spirals.

The spirals of the coils may be inverted relative to the description provided above so that the spiral distal ends 226 (i.e., the outermost portions of the coils) are anchored to the coil platform 222 and the spiral proximal ends 224 (coil innermost portions) are decoupled from substrate and free to extend upward. In this alternative embodiment, the bridge 210 is attached to the innermost portions of the coils.

In another alternative embodiment, three actuators may be provided to control the mirror. In the preferred embodiment disclosed above, the four actuators (i.e., coil pairs) make the system mechanically over-specified (i.e., the system can move about more axes than are necessary for the preferred applications). In contrast, a system having three actuators can provide the desired motion. The three actuators would be located at three of the four mirror corners. A center actuator, located between the two other actuators, would elevate a mirror corner and pivot the mirror about the other two, diagonally opposed, actuators to tilt the mirror about a diagonal axis. Each other coil pair would likewise lift a mirror corner, but would pivot the mirror about the two actuators that lie along a shared mirror side so as to pivot the mirror about an x-axis or y-axis, respectively.

The drawings and preferred embodiments show and describe a rectangular mirror supported by four actuators located at each of four corners. Alternatively, greater of fewer actuators may support the mirror at locations other than the mirror corners.

The coils may be provided with increased stiffness by providing metal springs across the coil spirals. However, such an arrangement may require a large current that may create ohmic heating sufficient to melt the coils in order to provide enough current to deflect the coils. However, such an arrangement is likely suitable in combination with a fabrication process that electrically isolates the coils from the mirror.

Preferred embodiments provide a permanent magnet coupled to a reverse side of the substrate. In an alternative fabrication embodiment, a ferro-magnetic layer may be formed within, or on, the substrate to eliminate the need for the additional mechanical step of attaching a magnet.

Another alternative means for providing a repulsive magnetic field is to fabricate a large coil on the reverse side of the substrate, or as a bottom layer on the obverse side of the substrate and provide current to the large coil to create a magnetic field. In this embodiment, the modulating current described above, that is provided to the actuator coils, may be eliminated and instead the current provided to the large coil may be made to modulate so as uniformly raise and lower the mirror.

In the first preferred embodiment, described above, the repulsive magnetic force is created by located a permanent magnet near the substrate and creating an electromagnet in the expanding coils. In an alternative embodiment, the coils 208 are formed of a magnetic material and are not coupled to, or conducting, current. In this embodiment, the expanding, magnetic coils have properties of a permanent magnet and thus create B fields. The repulsive magnetic force may then be created by a large (relatively) electromagnetic coil that is formed, or located, on the substrate 206, or on a second substrate that is located in proximity to the substrate 206. Schematically, this embodiment appears substantially as shown in FIGS. 16–20, except that the block 212 would represent a second substrate have one or more electromagnet coils thereon that are coupled to power sources. Preferably, separate electromagnet coils would be provided for each actuator 202 to enable separate control of each individual actuator. Operation of the electromagnet coils would create a magnetic field that would be oriented so as to oppose the magnetic field of the expanding, magnetic-material coils 208. The repulsive force would urge the magnetic material coils 208 to expand, thereby moving the mirror 200.

This embodiment in which the coils 208 are magnetic material coils solves problems that may occur in the first preferred embodiment. Strain induces a change in resistance in conducting devices, such as the conductive coils of the first embodiment. Thus, very precise control may be difficult in some operations, such as moving the coil to a precise location and holding it in that location. Using magnetic-material coils 208 and creating a repulsive magnetic force by means of an electromagnet coil, substantially reduces the possibility of strain induced effects because strain-dependent magnetic properties are relatively negligible. Additionally, the actuators in this embodiment need not be spirals that deploy to helix shape in their extended state. Any shape of magnetic material that provides a magnetic field and that is coupled to the substrate and the device being deployed (such as the mirror 200) such that the magnetic material actuator can deflect away from the substrate, is suitable.

While preferred embodiments of the present invention incorporate specific physical members having a configuration, the present invention may be incorporated into other configurations having greater or fewer coils, coil turns, arrangements and coils coupled in different configurations.

Exemplarily, the coil width on the coils 208 of the first preferred embodiment can be varied to substantially change the coil properties. As stated, the coils are spirals 216 and each spiral has a width along a dimension that is substantially parallel to the substrate 206. In the first preferred embodiment, the spiral width is substantially constant along its length and the outmost portions of the coils are the least stiff. By increasing the spiral width at the outermost portions of the coils, so that the spiral width is narrowest near its center, the stiffness can by modified as desired to provided optimum deployment characteristics. Similarly, changing the electrical resistance of the spiral along its length, such as by changing the width of the metal layer along the spiral length, can also effect the deployed characteristics of the coils. In all cases in which the coils are spirals in their flat, undeployed state, the deployed shaped is referred to herein as helix.

This specification sets forth the best mode for carrying out the invention as known at the time of filing the patent application and provides sufficient information to enable a person skilled in the art to make and use the invention. The specification further describes materials, shapes, configurations and arrangements of parts for making and using the invention. However, it is intended that the scope of the invention shall be limited only by the language of the claims and the law of the land as pertains to valid patents.

What is claimed is:

1. A microelectrical mechanical actuator, comprising:
   (a) a planar substrate;
   (b) a first coil member having a first end fixedly coupled to the substrate and a second end that is decoupled from the substrate;
   (c) a second coil member having a first end fixedly coupled to the substrate and a second end that is decoupled from the substrate and wherein the second ends of the first and second coil members are coupled together; and
   (d) magnetic flux means located proximate the first and second coil members that provides a first magnetic flux, and wherein electrical current is conducted along the first and second coil members and thereby creates a coil magnetic flux in the first and second coils and the first magnetic flux is substantially opposed to the coil magnetic flux thereby causing the second ends of the first and second coil members to move relative to the substrate.

2. The microelectrical mechanical actuator of claim 1 wherein the first and second coils are conical helical coils.

3. The microelectrical mechanical actuator of claim 1 wherein the magnetic flux means is a permanent magnet located on a surface of the substrate opposed to a surface of the substrate on which the first and second coil members are located.

4. The microelectrical mechanical actuator of claim 1 wherein the magnetic flux means is a third coil member conducting current.

5. The microelectrical mechanical actuator of claim 1 wherein the magnetic flux means is a ferromagnetic material coupled to the substrate.

6. The microelectrical mechanical actuator of claim 1 further comprising a bridge that couples the second ends of the first and second coil members.

* * * * *